(12) United States Patent
Baus et al.

(10) Patent No.: US 8,648,622 B2
(45) Date of Patent: Feb. 11, 2014

(54) METHOD AND DEVICE FOR MONITORING A FREQUENCY SIGNAL

(75) Inventors: Michael Baus, Bietigheim-Bissingen (DE); Michael Stemmler, Bruchsal (DE)

(73) Assignee: Robert Bosch GmbH, Stuttgart (DE)

( * ) Notice: Subject to any disclaimer, the term of this patent is extended or adjusted under 35 U.S.C. 154(b) by 12 days.

(21) Appl. No.: 13/522,927

(22) PCT Filed: Nov. 26, 2010

(86) PCT No.: PCT/EP2010/068307
§ 371 (c)(1),
(2), (4) Date: Jul. 18, 2012

(87) PCT Pub. No.: WO2011/085855
PCT Pub. Date: Jul. 21, 2011

(65) Prior Publication Data
US 2012/0286825 A1 Nov. 15, 2012

(30) Foreign Application Priority Data

Jan. 18, 2010 (DE) .......................... 10 2010 000 962

(51) Int. Cl.
*G01R 23/02* (2006.01)
(52) U.S. Cl.
USPC .............. 327/47; 327/39; 327/48; 324/76.41; 324/76.48; 713/501; 713/502
(58) Field of Classification Search
USPC .......... 327/39–42, 47, 48; 377/39; 324/76.39, 324/76.41, 76.47, 76.48; 713/500–503
See application file for complete search history.

(56) References Cited

U.S. PATENT DOCUMENTS 5,657,361 A  8/1997 Inagaki et al.
(Continued)

FOREIGN PATENT DOCUMENTS

| DE | 103 44 004 A1 | 4/2004 |
| DE | 103 47 413 A1 | 5/2005 |
| EP | 1 675 267 A1 | 6/2006 |
| WO | 2006/104770 A2 | 10/2006 |

OTHER PUBLICATIONS

International Search Report corresponding to PCT Application No. PCT/EP2010/068307, mailed Feb. 17, 2011 (German and English language document) (5 pages).

*Primary Examiner* — Patrick O'Neill
(74) *Attorney, Agent, or Firm* — Maginot, Moore & Beck

(57) ABSTRACT

A method for monitoring a frequency signal provided within a unit is disclosed. The method comprises a step of receiving one or more binary signal levels of a cycle signal (CLK) or a control signal (CS) from a communication interface (CLK, CS, MOSI, MISO), wherein the communication interface (CLK, CS, MOSI, MISO) is designed to transfer information according to a communication protocol. The method further comprises a step of providing the frequency signal in the unit and comparing the frequency signal to a temporal sequence of signal levels of the cycle signal (CLK) received by the communication interface (CLK, CS, MOSI, MISO) in order to obtain a comparison result or controlling a counter by the control signal (CS) and the frequency signal in order to obtain a counter status. Finally, the method according to the disclosure comprises a step of recognizing a predetermined quality of the frequency signal if the comparison result fulfills a predetermined criterion or if the counter status lies within a predetermined value range in order to monitor by the recognized quality of the frequency signal.

8 Claims, 3 Drawing Sheets

(56) References Cited

U.S. PATENT DOCUMENTS

| | | | |
|---|---|---|---|
| 7,134,042 B2 * | 11/2006 | Shimasaki | 714/4.1 |
| 7,154,305 B2 * | 12/2006 | Driediger et al. | 327/47 |
| 7,308,595 B2 * | 12/2007 | Windmueller | 713/500 |
| 7,406,615 B2 * | 7/2008 | Mattes et al. | 713/500 |
| 7,454,645 B2 * | 11/2008 | Li et al. | 713/500 |
| 8,145,935 B2 * | 3/2012 | Park et al. | 713/500 |

* cited by examiner

METHOD AND DEVICE FOR MONITORING A FREQUENCY SIGNAL

This application is a 35 U.S.C. §371 National Stage Application of PCT/EP2010/068307, filed on Nov. 26, 2010, which claims the benefit of priority to Ser. No. DE 10 2010 000 962.8, filed on Jan. 18, 2010 in Germany, the disclosures of which are incorporated herein by reference in their entirety.

BACKGROUND

The present disclosure relates to a method for monitoring, an apparatus for monitoring and a monitoring apparatus for monitoring.

Digital sensors and sensors with analog clocking often require a clock for operation. This clock can either be supplied externally or can be generated by means of an oscillator. In the case of rotation rate sensors, the mechanical sensor itself is used as an oscillator in order to generate an internal clock using an ordinary phase locked loop circuit (PLL). For sensors with safety-critical functions, which are used in the sensor system of vehicle stabilization programs (ESP), for example, a great demand is made on the dependability of the sensor. This includes monitoring the clock used, inter alia. Firstly, the monitoring is used to draw conclusions about the internal signal processing, and secondly, in the case of rotation rate sensors, conclusions can be drawn about the mechanical functionality of the sensor element if the frequency which can be derived from the clock used is monitored.

Today, four types of frequency monitoring operations are known and to some extent are used in current Bosch sensor generation, such as MM3 or MM5, or possibly even in competing products. The following methods are used:
1) Logic monitoring, using a digital interface, for example SPI.
2) Monitoring by means of a second, externally supplied clock.
3) Monitoring using a crystal or other type of oscillator, which is used in addition to the mechanical oscillator.
4) Monitoring by means of a clock which is provided externally by the sensor and is monitored by an external unit.

DE 103 47 413 A1 shows a controller with clocked data transmission between a processor and at least one further circuit, wherein the processor itself outputs the clock. The processor monitors the clock using the output signals from at least two clock outputs.

SUMMARY

Against this background, the present disclosure presents a method, in addition an apparatus and a monitoring apparatus which uses said method, and finally an appropriate computer program product. Advantageous refinements can be found in the description below.

The present disclosure provides a method for monitoring a frequency signal which is provided within a unit, wherein the method has the following steps:
  one or more binary signal levels of a clock signal or of a control signal is/are received from a communication interface, wherein the communication interface is designed to transmit information on the basis of a communication protocol;
  the frequency signal is provided in the unit; and
  the frequency signal is compared with a chronological sequence of signal levels of the clock signal received from the communication interface in order to obtain a comparison result, or a counter is controlled by the control signal and the frequency signal in order to obtain a counter reading; and
  a predetermined quality of the frequency signal is identified if the comparison result satisfies a predetermined criterion or if the counter reading is within a predetermined range of values in order to use the identified quality of the frequency signal to monitor the latter.

The present disclosure also provides an apparatus which is designed to carry out or implement the steps of the method according to the disclosure. In particular, the apparatus may have devices which are designed to each perform one step of the method. This variant embodiment of the disclosure in the form of an apparatus or a controller can also achieve the object on which the disclosure is based quickly and efficiently.

In the present case, an apparatus or a controller can be understood to mean a controller or generally an electrical appliance which, by way of example, processes sensor signals and takes this as a basis for outputting control signals or physical measured values. The controller may have an interface which may be in hardware and/or software form. In the case of a hardware form, the interfaces may be part of what is known as a system ASIC, for example, which contains a wide variety of functions of the controller. However, it is also possible for the interfaces to be separate, integrated circuits or at least to some extent to comprise discrete elements. In the case of a software form, the interfaces may be software modules which are present on a microcontroller in addition to other software modules, for example.

The present disclosure also provides a monitoring apparatus for monitoring a frequency signal, wherein the monitoring apparatus has the following features:
  an apparatus, as has been described above;
  a bus transmission system which is connected to the communication interface of the apparatus and is designed for data transmission from the apparatus to a control unit;
  the control unit, which is designed to output a clock signal or a control signal for the purpose of activating the apparatus, wherein the control unit is also designed to perform monitoring of the frequency signal such that an error warning signal is output if the result signal does not match an expected result signal.

Another advantage is a computer program product having program code which is stored on a machine-readable storage medium, such as a semiconductor memory, a hard disk memory or an optical memory, and is used to carry out the method according to one of the embodiments described above when the program is executed on the aforementioned apparatus.

The present disclosure affords the advantage that, in comparison with methods 2) and 4) cited above, no separate (hardware) connection for the input or output of a second clock is required. In comparison with method 3) described above, there is likewise no need for a further input or a further element, such as an oscillator. In the case of methods 1) and 4), the frequency monitoring is undertaken by an external computer, such as a microcontroller (μC), an additional circuit (ASIC) or an appropriate controller, which means increased computation complexity and makes technically greater demands on then user of the sensor and requires additional applications.

In summary, it can therefore be stated that important advantages of the design according to the disclosure can be seen in that no additional PINs or connections on the sensor are required for the frequency monitoring, no additional demands are made on the user of the sensor, since a communication interface is already present, no further or additional chips (such as a crystal) are required, and it is also possible for the frequency monitoring to be implemented inside the sensor or inside another separate unit, for example, and thus no complexity arises for additional applications.

It is advantageous if, in addition, a step of outputting a supervisory signal via a signal line of the communication interface takes place if the identified quality of the frequency signal satisfies a defined criterion. Such an embodiment of the disclosure affords the advantage that, even with an erroneous internal clock frequency identified in the unit internally, appropriate signaling can be output to a second unit (for example a master or control unit). In this case, the prescribed criterion may be an expected counter reading, for example, from which a counter reading which is controlled by the internal frequency signal differs by no more than a prescribed tolerance range. In this case, the erroneous internal frequency signal can likewise be signaled via the signal lines of the communication interface, so that in turn it is not necessary to provide a separate pin for this signal.

In another embodiment, it is also possible for the step of comparison to involve a second counter being controlled by the control signal and the signal level of the clock signal received from the communication interface in order to obtain a second counter reading, wherein it is possible for the step of identification to involve the predetermined quality being identified if the second counter reading is in a range of values which differs from the counter reading of the counter by no more than a predefined tolerance value. Such an embodiment of the disclosure affords the advantage that not only is continuous monitoring of the frequency signal possible but also monitoring in time intervals. During these time intervals, a counter then runs, so that when the period of the time interval has elapsed it is possible for the counter reading to be compared with an expected counter reading which ought to be reached if the internal frequency signal is error-free.

In order to permit reliable monitoring of sensors, in particular, which often have to record highly safety-critical sensor data, one specific embodiment of the disclosure may also involve the unit being a sensor, wherein the method may also comprise a step of transmitting a measurement signal which represents a physical variable via a signal line of the communication interface. Such an embodiment of the present disclosure affords the advantage that a sensor unit can be connected and the measurement signal generated by means of the sensor unit can be transmitted via a bus signal line for further processing. This allows a highly reliable provision of the measurement signal which has been generated using the precisely monitored frequency signal.

In order to be able to use communication lines which have already been well tested, in particular, and are often already present in application environments for the disclosure, it is possible for the step of receiving to involve receiving data via the signal lines of the communication interface on the basis of a standardized communication protocol, particular an SPI, CAN, PSIS, FlexRay or other bus protocol. Such an embodiment of the present disclosure affords the advantage that a standardized bus protocol may to some extent contain routines for testing the bus communication interface for operability. In particular, customization of the transmission of data on the basis of a standardized bus protocol allows bus protocols in use to be selected, such as SPI, CAN, FlexRay or a PSIS bus protocol.

So as also to facilitate the obtainment of the external clock signal, so that it is not necessary to provide a separate clock line in the communication interface, the step of receiving may involve generating the clock signal from signal edge changes in at least one signal which, in addition to the clock information, contains at least one further data information item. By way of example, this also allows a clock signal for checking the internal frequency signal to be generated from signals which are provided for data transmission via the communication interface. This affords the advantage that it is possible to use a smaller communication interface with a smaller number of pins in order nevertheless to be able to check the frequency signal which has been generated in the unit.

BRIEF DESCRIPTION OF THE DRAWINGS

The disclosure is explained in more detail by way of example with reference to the appended drawings, in which.

DETAILED DESCRIPTION

Elements which are the same or similar may be provided with the same or similar reference symbols in the figures, and a description thereof is not repeated. In addition, the figures of the drawings, the description thereof and the claims contain numerous features in combination. In this case, it is clear to a person skilled in the art that these features can also be considered individually or that they can be combined to produce further combinations, which are not described explicitly here. In addition, method steps according to the disclosure can be repeated and can be executed in an order different than that described. If an exemplary embodiment comprises an "and/or" conjunction between a first feature/step and a second feature/step, this can be read to mean that the exemplary embodiment has both the first feature/the first step and the second feature/the second step according to one embodiment and has either only the first feature/step or only the second feature/step according to a further embodiment.

Figure 1:
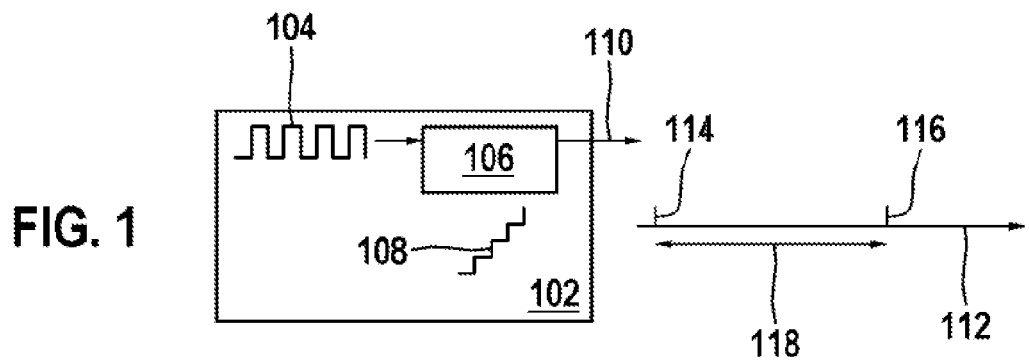
FIG. 1 shows a block diagram of an exemplary embodiment.

FIG. 1 shows a sensor 102 which comprises a counter 106. A clock 104 generated within the sensor 102 is supplied to the counter 106. The effect of the internal clock 104 in the counter 106 is a discrete, step-by-step increase in the counter reading, shown symbolically by a stair function 108. An SPI interface 110 can be used to tap off the counter reading at the output of the counter 106. A time axis 112 is used to illustrate the method for frequency ascertainment. In this regard, a counter reading I is determined and stored at a first time 114, and a counter reading II is determined and stored at a later time 116, via the SPI interface 110. A difference formed from the counter reading I and the counter reading II is used to determine a counter reading difference. If a firmly prescribed period of time 118 is chosen between the first time 114 and the later time 116, it is a very simple matter to determine the frequency from the counter reading difference per time period 118.

Figure 2:
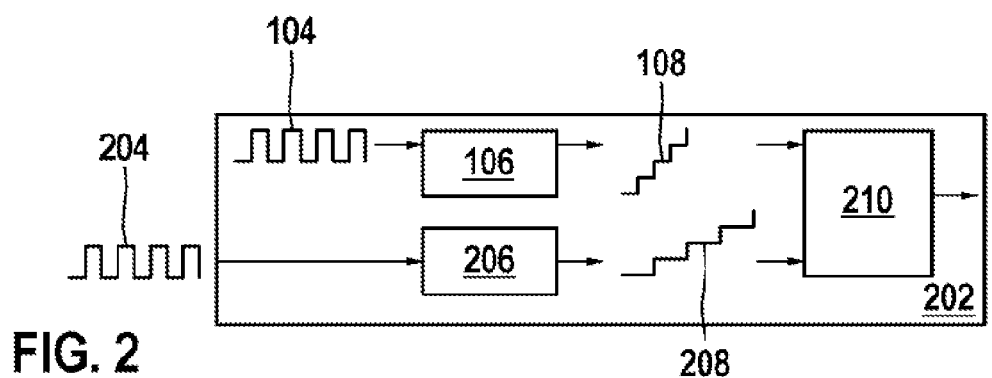
FIG. 2 shows a block diagram of a further exemplary embodiment.

FIG. 2 shows a sensor 202 which is of similar design to the sensor 102 from FIG. 1, but with—in contrast to the sensor from FIG. 1—a second counter 206 now being arranged within the sensor 202, said second counter being fed by an external clock 204. Both the counter reading of the first counter 106 and the counter reading of the second counter 206 are increased the internal clock 104 or the external clock 204, shown symbolically by the stair function 108, 208. The counter readings are each provided at the output of the relevant counters. In this case, the output of the first counter 106 and the output of the second counter 206 are supplied directly to the different inputs of a comparison unit 210 which is arranged inside the sensor 102. The signal at the output of the comparison unit 210 can be tapped off and the signal value of the signal can be taken as a basis for deciding whether the internal clock 104 corresponds to the external clock 204 as a reference clock.

Figure 3:
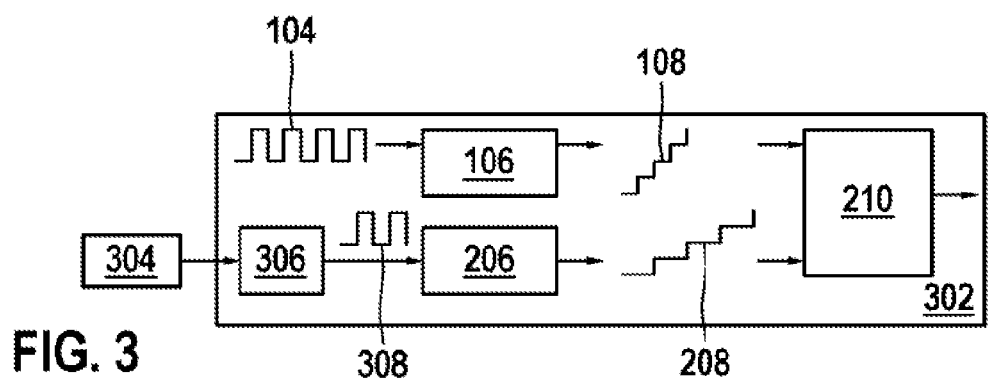
FIG. 3 shows a block diagram of another exemplary embodiment.

FIG. 3 shows a sensor 302 which is of similar design to the sensor from FIG. 2, but with the second counter 206 being fed by a PLL unit 306 and being arranged inside the sensor 302. A crystal element 304 generates a periodic electrical signal which is converted into a reference clock 308 by means of the PLL unit 306 and is supplied to the second counter 206. Upon every clock cycle, for example upon every rising clock edge both of the internal clock 104 and of the reference clock 308, the counter reading of the first counter 106 or of the second counter 206 is increased discretely, illustrated by means of the stair functions 108, 208 shown. The outputs of the two counters 106, 206 are supplied to different inputs of a comparison unit 210. Comparison of the two counter readings using the comparison unit 210 produces a signal at the output of the comparison unit 210, with the signal value being able to be taken as a basis for making a decision for equality between the internal clock 104 and the reference clock 308.

Figure 4:
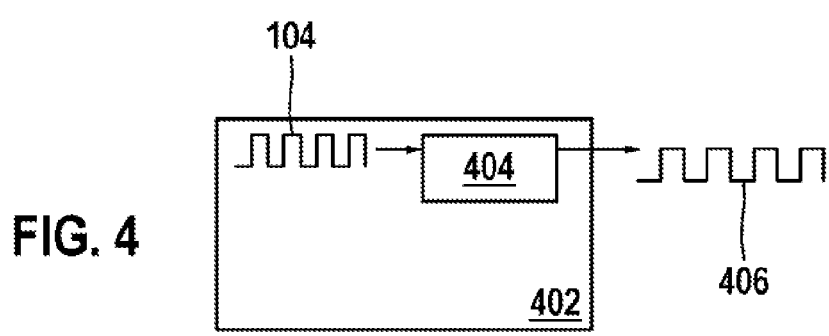
FIG. 4 shows a block diagram of an additional exemplary embodiment.

FIG. 4 shows a sensor 402 which comprises a converter 404 which is fed by an internal clock 104. At the output of the converter, it is possible to tap off a signal 406 which represents the internal clock. The signal at the clock output 406 can be transmitted to an external computer and a frequency can be ascertained from the transmitted clock signal.

Figure 5:
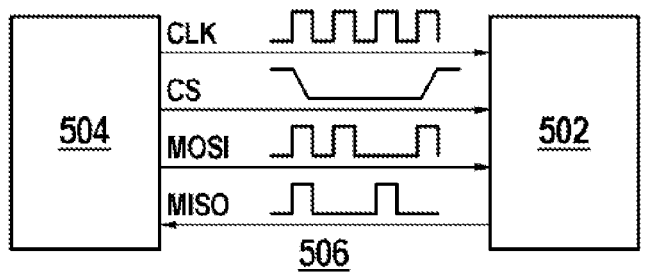
FIG. 5 shows a block diagram of a master/slave arrangement.

FIG. 5 shows an arrangement of a master unit 504, which may be a microcontroller, for example, and a slave unit 502, which may be a sensor unit, for example. The master unit 504 is connected to the slave unit 502 via a plurality of bus signal lines 506. A CLK signal generated or provided by the master unit 504 and transmitted via a bus signal line is used as a clock signal for the slave unit 502. A CS signal is used to activate the slave unit 502. Communication or data interchange between the master unit 504 and the slave unit 502 takes place via an MOSI channel and an MISO channel of the bus signal lines.

The approaches shown in FIGS. 1 to 4 are based on comparing the ascertained clock frequency of the sensor with a second frequency. In FIG. 1, a counter 106 inside the sensor operates with the sensor-internal clock 104. The current internal counter reading of the first counter 106 can be read by means of specific queries at the times 114 and 116 via the interface 110 to the sensor. By knowing the times 114 and 116 at which the counter reading of the first counter 106 has been read, which define the times of the queries, in particular, it is possible to relate the counting speed of the sensor-internal counter, which speed is directly dependent on the sensor-internal clock frequency 104, to the time difference 118 between the two query times. The query times are stipulated by a clock, which is usually independent of the internal clock.

As a result of the period of time 118 between the two query times 114 and 116 being related to the counter reading that is to be expected, it is possible for the sensor-internal clock 104 to be monitored redundantly. In addition to the elements from FIG. 1, FIG. 2 has a further counter 206 in use which is fed by an external clock 204. The counter reading 108 which is output at the output of the counter 106 can be compared with counter readings 208 from further counters 206 by means of a comparison unit 210. The design shown in FIG. 3 differs from the design from FIG. 2 only in that, in FIG. 3, a second clock 308 is first generated inside the sensor from an external oscillator or crystal 304 via a PLL unit 306. This second, externally supplied 204 or internally generated clock 304 can be compared with the actual system clock 104. The comparison is made by increasing, for example upon every rising clock edge, two counters 106 and 206, a first counter 106, based on the internal clock 104, and a second counter 206, based on the external clock 204 or 304. After a certain time, i.e. when one counter has reached a particular value, for example, the two counter readings 108 and 208 are compared. As a result, it is possible to compare the internal system clock 104 with a second redundant clock 204 or 304. The approach shown in FIG. 4 differs from the approach shown in FIG. 2 in that the sensor-internal clock 104 is routed to the outside and an external computer, such as a microcontroller, an ASIC or another controller, has to compare this clock 406 with its own clock, and this comparison and the external assessment do not take place inside the sensor. In addition, most sensors have a digital interface. One possible form of such an interface is an SPI (Serial Peripheral Interface) interface, which is shown schematically in FIG. 5. Such an interface comprises four lines 506, which are denoted CS, MISO, MOSI and CLK. While the Chip Select line (CS) is used by the master 504 to activate a slave unit 502, the clock line (CLK) is used to output clock pulses provided by the master 504 and to send data at different clock edges via the data output (MOSI). The slave 506 can use its data output line (MISO) to send data to the master 504 in sync with the clock. The number of clock cycles and the precise timing differ from protocol to protocol.

Sensors are normally connected to the SPI interface in a slave configuration. An important feature of one particular exemplary embodiment of the disclosure which is utilized in the approach described below is that the clock on the CLK line is generated in exactly the same way as the clock from the frequency monitoring by an independent clock generator and has a high level of clock precision. Similarly, the edges from the CS line are usually determined deterministically by the clock of the master.

Figure 6:
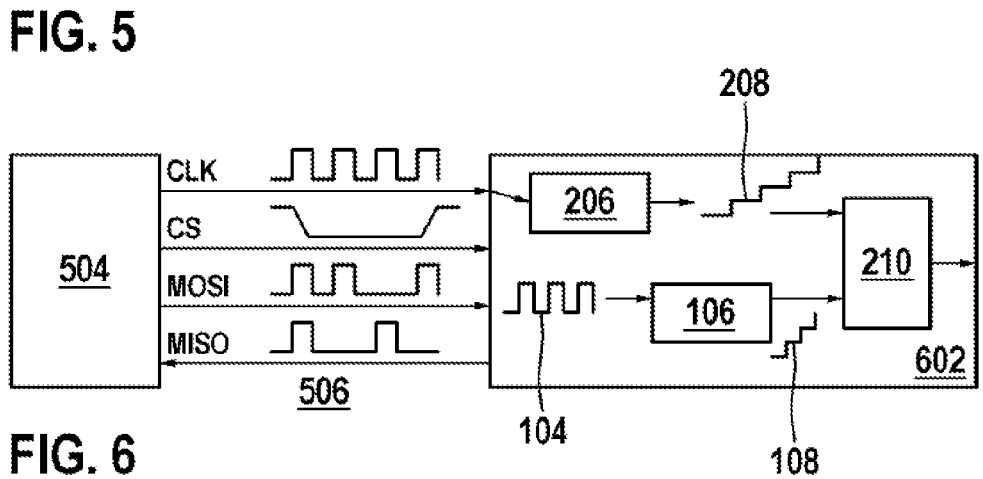
FIG. 6 shows a block diagram of a first exemplary embodiment according to the present disclosure.

FIG. 6 shows a block diagram of a slave unit 602 which is connected to a master unit 504 via a plurality of bus signal lines 506. A CS signal which is transmitted via a bus signal line actuates a counter 206 which is arranged within the slave unit 602, with a counter reading being able to be output at the output of the counter 206. While the counter 206 is being actuated by means of the CS signal, a counter reading increase takes place for each clock period of the CLK signal. A symbolic illustration of the counter reading increase shows a stair function 208. An internal clock 104 is supplied to the counter 106, and a signal is provided at the output of the counter 106. The signal corresponds to a counter reading, the discrete increase in the counter reading can be represented by the stair function 108. The output of the counter 106 and the output of the counter 206 are supplied to different inputs of a comparison unit 210. At the output of the comparison unit 210, it is possible to tap off a signal. Depending on the signal value, it is possible to decide whether the internal clock 104 corresponds to the clock of the CLK signal. In addition, the bus signals lines MOSI and MISO can be used to interchange data between the master unit 504 and the slave unit 602. By way of example, a signal is transmitted as an output signal via the MISO bus signal line, which signal represents a comparison result from the comparator 210. This communicates to the master 504 a piece of information about the comparison result so as in this way to supervise the monitoring of the internal clock from the master 504.

Figure 7:
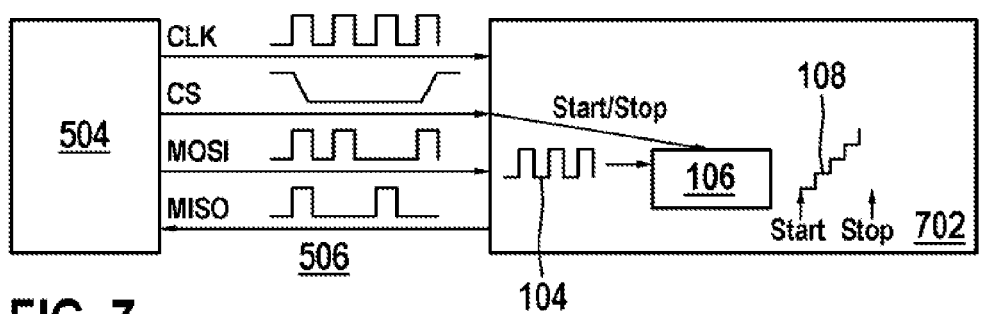
FIG. 7 shows a block diagram of a further exemplary embodiment according to the present disclosure.

FIG. 7 shows a master unit 504 which is connected to a slave unit 702 via a plurality of bus signal lines 506. The slave unit 702 comprises a counter 106 which is actuated by means of an internal clock 104. A counter reading provided at the output of the counter 106 is increased discretely in response to edges of the internal clock signal 104. A discrete increase in the counter reading of the counter 106 is shown by a stair function 108. In addition, the CS bus signal line is connected to the counter 106 in order to allow a start and stop function for the counter 106. Upon an appropriate signal, i.e. in response to a signal edge or a level of the signal on the CS bus signal line (which is used as a starting criterion for the counter 106), the counter 106 is started and an appropriate starting counter reading is stored beforehand. Similarly, upon a signal on the CS bus signal line, i.e. in response to a signal edge or a level of the signal on the CS bus signal line as a stop criterion, the counter 106 is stopped and an appropriate final counter reading is stored beforehand. From the final counter reading and the starting counter reading, a counter reading difference is ascertained. In addition, the bus signal lines MOSI and MISO are used to interchange data between the master unit 504 and the slave unit 702 at a clock rate which is prescribed by the CLK signal. By way of example, a signal which represents a comparison result from the comparator 210 is transmitted to the master 504 as an output signal via the MISO bus signal line. This communicates to the master 504 a piece of information about the comparison result so as in this way to supervise the monitoring of the internal clock from the master 504.

Figure 8:
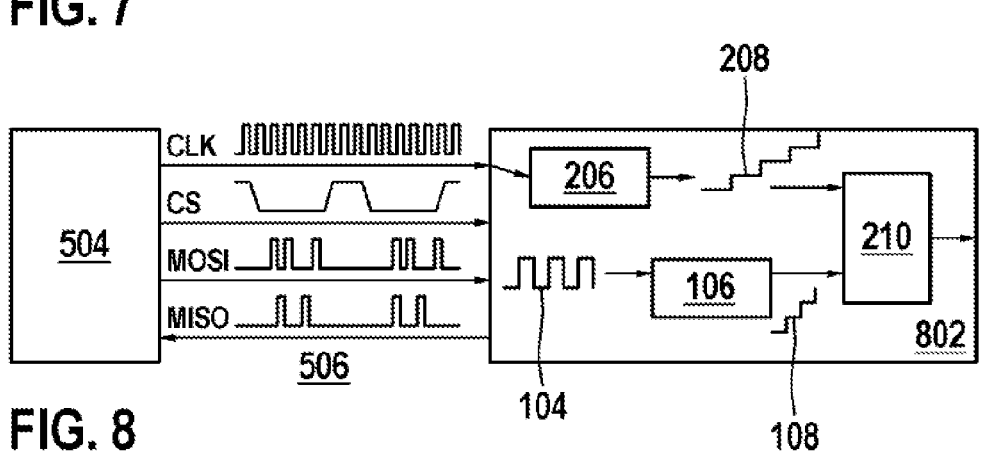
FIG. 8 shows a block diagram of an additional exemplary embodiment according to the present disclosure.

FIG. 8 shows an illustration of a further exemplary embodiment of the disclosure, with FIG. 7 showing a slave unit 802 which is of a design similar to that in FIG. 6. The slave unit 802 is connected to a master unit 504 via a bus system, comprising a plurality of bus signal lines 506. The individual bus signal lines transmit signals, such as a bus clock signal (CLK), a signal for selecting and activating one of a plurality of slave units (CS), and signals (MOSI and/or MISO) which allow communication between the master unit 504 and the slave unit 802. The slave unit 802 contains a first counter 106 and a second counter 206, wherein an output of the first counter 106 and an output of the second counter 206 are connected to different inputs of a comparison unit 210. The comparison unit 210 is arranged within the slave unit 802. An internal clock 104 controls the first counter 106 by providing a counter reading from the first counter 106 at a first input of the comparison unit 210, with the counter reading of the counter 106 being increased during a clock cycle of the internal clock 104. Such an increase is shown by way of example by a stair function 108. A combination of signals from individual bus signal lines (for example the combination of the signals CLK and CS) forms a clock signal for the input, of the second counter 206, with a counter reading of the second counter 206 being increased during a clock cycle of the clock signal. Such an increase in the counter reading is shown by way of example by a stair function 208. The counter reading of the second counter 206 is provided as a second input of the comparison unit 210. At an output of the comparison unit 210, an output signal is tapped off, in which case a value of the output signal is obtained depending on whether the counter reading of the internal clock 104 corresponds to the counter reading of the clock signal. In addition, the CS signal can be used to activate a slave unit from a plurality of slave units. By way of example, a signal which represents a comparison result from the comparator 210 is transmitted to the master 504 as an output signal by the MISO bus signal line. This communicates to the master 504 a piece of information about the comparison result so as in this way to supervise the monitoring of the internal clock from the master 504.

Instead of the frequency monitoring options currently used in the prior art, it would also be possible to use one or more of the SPI lines to compare the internal sensor clock against a further clock. As one option, it would be possible for a counter inside the sensor to be increased on the basis of the SPI clock (as described in the approach shown in FIG. 6) and compared with a counter reading which is increased in response to the sensor-internal clock. Alternatively, the activation of the CS signal in accordance with the approach shown in FIG. 7 could be used to increase a counter reading of a counter with the internal clock, the deactivation of the CS signal being able to be used to "freeze" the counter reading of this counter and to compare the "frozen" counter reading against a target value.

The following extensions, details or modifications are also conceivable.

Since SPI communication regularly occurs during normal sensor operation, it would be possible for the monitoring to achieve a very high level of monitoring coverage over time. In addition, it would be possible to incorporate monitoring which checks whether SPI communication takes place at all and, if so, with what frequency and therefore the monitoring according to the disclosure is possible and achieves a high level of coverage over time.

In order to achieve maximum coverage over time, it would be possible for the clock of the SPI also to be sent while no communication is taking place via the MISO and MOSI bus data lines. In this case, the sensor would continue to pick up the communication when an appropriate CS level is actuated. For this case, the master to send clock pulses during the phases in which no communication is taking place.

A modification that is specific to sensor and communication could involve a use, by way of example, of just some of the SPI clock (i.e. of the bus clock), such as the first eight clock pulses or a combination of SPI clock pulses and CS signal edges. A further option is also to use the data lines to generate a clock from the edges of the data lines, which clock is used to control a counter which can be compared against a counter with an internal clock.

Features of the disclosure can naturally be implemented not only with SPI interfaces but also with various other interfaces from which an independent clock is derived or triggering which is constant over time is possible, such as with a Can, FlexRay or PSIS.

The approach presented here for monitoring a frequency signal could be applied to each SPI command or just to specific commands or just on the basis of previous activation.

The approach to frequency monitoring presented here can naturally also be applied to any other system, such as a microcontroller or ASICs, which is reliant on an external clock and is equipped with an interface which permits the approach to monitoring presented here.

Figure 9:
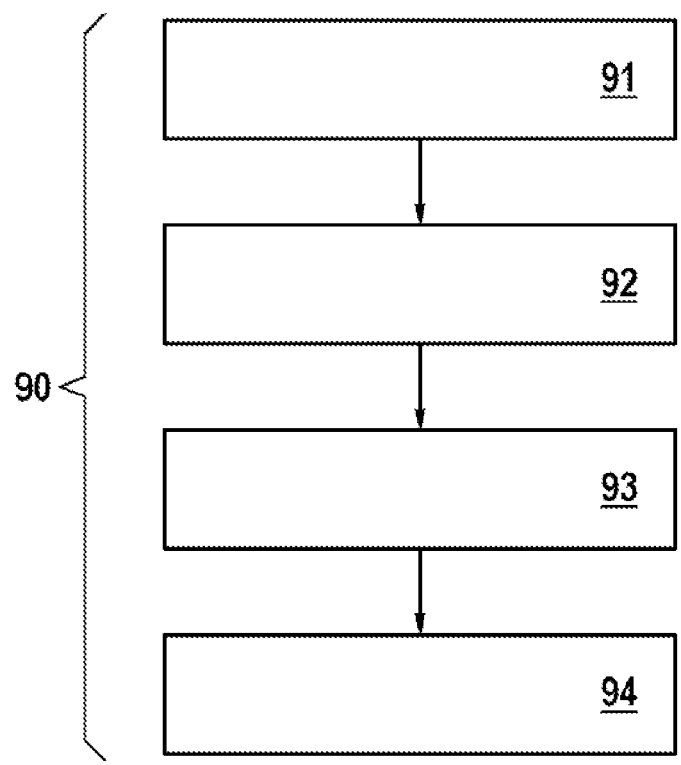
FIG. 9 shows a flowchart for an exemplary embodiment of the disclosure as a method.

FIG. 9 shows a flowchart for a method 90 for monitoring a frequency signal which is provided within a unit. In this case, the method 90 comprises a step of receiving 91 one or more binary signal levels of a clock signal or of a control signal from a communication interface, wherein the communication interface is designed to transmit information on the basis of a communication protocol. In addition, the method 90 comprises a step of providing 92 the frequency signal in the unit and a step of comparing 93 the frequency signal with a chronological sequence of signal levels of the clock signal received from the communication interface in order to obtain a comparison result or controlling a counter by means of the control signal and the frequency signal in order to obtain a counter reading. Finally, the method 90 comprises a step of identifying 94 a predetermined quality of the frequency signal if the comparison result satisfies a predetermined criterion or if the counter reading is within a predetermined range of values in order to use the identified quality of the frequency signal to monitor the latter.

The invention claimed is:

1. A method for monitoring a frequency signal which is provided within a unit, comprising:
   receiving one or more binary signal levels of a clock signal or of a control signal from a communication interface, wherein the communication interface is configured to transmit information on the basis of a communication protocol;
   providing the frequency signal in the unit;
   comparing the frequency signal with a chronological sequence of signal levels of the clock signal received from the communication interface so as to obtain a comparison result, or controlling a counter by the control signal and the frequency signal so as to obtain a counter reading; and
   identifying a predetermined quality of the frequency signal if the comparison result satisfies a predetermined criterion or if the counter reading is within a predetermined range of values so as to use the identified quality of the frequency signal to monitor the latter.

2. The method as claimed in claim 1, further comprising outputting a supervisory signal via a signal line of the communication interface if the identified quality of the frequency signal satisfies a defined criterion.

3. The method as claimed in claim 1, wherein the comparing step involves controlling a second counter by the control signal and the signal level of the clock signal received from the communication interface so as to obtain a second counter reading, wherein the identification step involves identifying the predetermined quality if the second counter reading is in a range of values which differs from the counter reading of the counter by no more than a predefined tolerance value.

4. The method as claimed in claim 1, wherein the unit is a sensor, and wherein the method also comprises transmitting a measurement signal which represents a physical variable via a signal line of the communication interface.

5. The method as claimed in claim 1, wherein the receiving step involves receiving data via the signal lines of the communication interface on the basis of a standardized communication protocol.

6. The method as claimed in claim 5, wherein the standardized communication protocol is one of an SPI, CAN and PSI5 bus protocol.

7. The method as claimed in claim 1 wherein the receiving step involves generating the clock signal from signal edge changes in at least one signal which, in addition to the clock information, contains at least one further data information item.

8. A computer program product having program code, which is stored on a non-transitory machine-readable storage medium, for carrying out a method for monitoring a frequency signal which is provided within a unit, the method comprising:
   receiving one or more binary signal levels of a clock signal or of a control signal from a communication interface, wherein the communication interface is configured to transmit information on the basis of a communication protocol;
   providing the frequency signal in the unit;
   comparing the frequency signal with a chronological sequence of signal levels of the clock signal received from the communication interface so as to obtain a comparison result, or controlling a counter by the control signal and the frequency signal so as to obtain a counter reading; and
   identifying a predetermined quality of the frequency signal if the comparison result satisfies a predetermined criterion or if the counter reading is within a predetermined range of values so as to use the identified quality of the frequency signal to monitor the latter.

* * * * *